(12) United States Patent
Nanbu et al.

(10) Patent No.: US 6,414,277 B1
(45) Date of Patent: Jul. 2, 2002

(54) ULTRA-HIGH-TEMPERATURE HEAT TREATMENT APPARATUS

(75) Inventors: Toshio Nanbu, Kawasaki; Makoto Shinohara, Yokohama, both of (JP)

(73) Assignee: Shinku Giken Co., Ltd., Kawasaki (JP)

( * ) Notice: Subject to any disclaimer, the term of this patent is extended or adjusted under 35 U.S.C. 154(b) by 0 days.

(21) Appl. No.: 09/561,192

(22) Filed: Apr. 27, 2000

(30) Foreign Application Priority Data

Jan. 21, 2000 (JP) ........................................ 2000-013511

(51) Int. Cl.$^7$ ................................................. F27B 5/14
(52) U.S. Cl. ........................ 219/390; 219/405; 219/411; 392/416; 118/724; 118/725
(58) Field of Search ................................. 219/390, 405, 219/411; 392/416, 418; 118/724, 725, 50.1

(56) References Cited

U.S. PATENT DOCUMENTS

| | | | |
|---|---|---|---|
| 4,101,759 A | * 7/1978 | Anthony et al. | 219/343 |
| 4,553,022 A | * 11/1985 | Colombo | 219/275 |
| 5,578,132 A | * 11/1996 | Yamaga et al. | 118/724 |
| 5,775,889 A | * 7/1998 | Kobayashi et al. | 432/18 |
| 5,951,282 A | * 9/1999 | Sakata et al. | 432/241 |

* cited by examiner

Primary Examiner—Teresa Walberg
Assistant Examiner—Shawntina Fuqua
(74) Attorney, Agent, or Firm—Frishauf, Holtz, Goodman, & Chick, P.C.

(57) ABSTRACT

An ultra-high-temperature heat treatment apparatus includes an electric furnace, a furnace tube made of porous SiC/CVD-SiC, a heat-insulating apparatus fitted into the furnace tube for interrupting heat conduction from the furnace tube, a contamination control apparatus disposed beneath the furnace tube for preventing contamination in the furnace tube, and a separator mechanism for separating a wafer, subject to heat treatment in the furnace tube, from an annular holder. The electric furnace includes a heater comprised of heater elements which are replaceable independently of each other. Each heater element includes a heat-generating portion disposed along the inner wall face of the heat insulator so as not to be in close contact therewith, and a fixture portion fixed to the heat insulator. This heater construction makes it possible to reduce heater repair costs, suppress reactions between the heat-generating portions and the heat insulator, and suppress a contraction of the heat insulator.

7 Claims, 9 Drawing Sheets

FIG. 4A
FIG. 4B
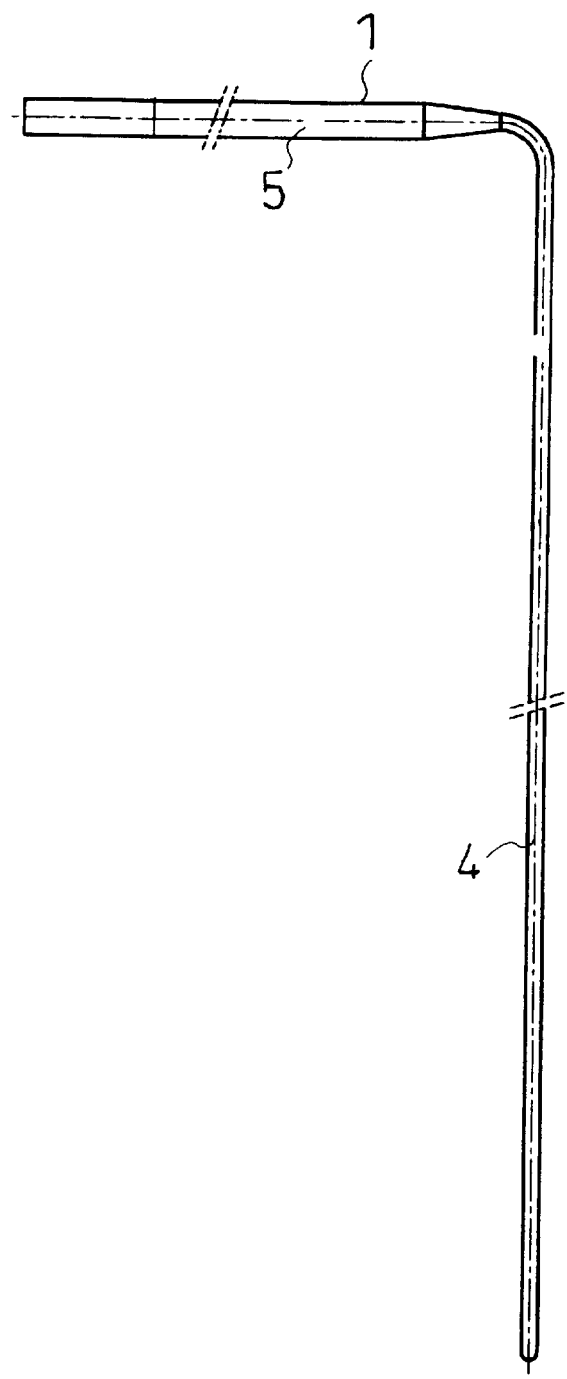
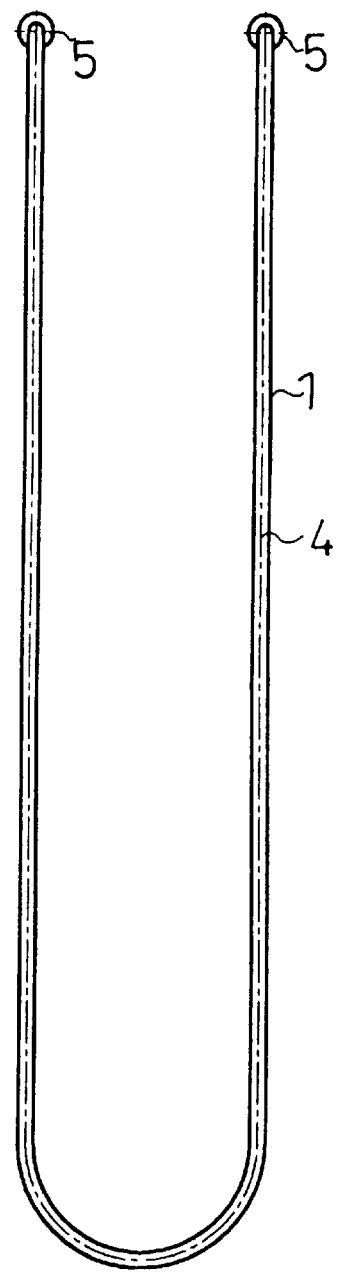

ULTRA-HIGH-TEMPERATURE HEAT TREATMENT APPARATUS

BACKGROUND OF THE INVENTION

1. Technical Field

The present invention relates to an ultra-high-temperature heat treatment apparatus.

2. Related Art

An ultra-high-temperature heat treatment apparatus having an electric furnace for use in heat treatment of wafers or the like is known. An electric heater of a conventional heat treatment apparatus is comprised of a single one-piece heater element which is installed in a spiral or folded form on the inner wall surface of a heat insulator of the electric furnace, with its heat generating portion directly fixed to the heat insulator. With such a one-piece heater structure, the whole heater element must be replaced even if the heater element is partly damaged, which is costly.

The conventional heat treatment apparatus further includes a water-cooled metal manifold and a furnace tube made of SiC/CVD-SiC and disposed above the metal manifold, the furnace tube being adapted to receive wafers or the like. An O-ring is inserted into a fitting portion between the furnace tube and the metal manifold, so as to prevent intrusion of contaminants from the outside. With this arrangement, however, it is difficult to increase the length of a uniform temperature zone of the furnace tube, and the furnace tube can be subject to a great heat shock.

Although the conventional heat treatment apparatus is configured to prevent the conduction of high temperature heat from the furnace tube, a SiC buffer is solely provided therefor, so that a large amount of heat may be transferred downwardly of the furnace tube, resulting in increased cooling costs to prevent the heat conduction.

Furthermore, the conventional heat treatment apparatus is provided with a flange which is vertically moveable relative to the above-mentioned manifold. To seal between the manifold and the flange, an O-ring is fitted into a tapered groove (generally, a dovetail groove) formed in a flat portion of the flange. However, the O-ring subject to high temperature heat sometimes sticks on the manifold to be detached from the tapered groove of the flange.

The conventional heat treatment apparatus further comprises a separator for loading a wafer into an annular holder and for separating the wafer from the holder. The separator is configured to push the wafer upward to separate the wafer and push the wafer downward to load the same into the holder. However, the work efficiency of the separator is not satisfactory.

SUMMARY OF THE INVENTION

An object of the present invention is to provide an ultra-high-temperature heat treatment apparatus including an electric furnace having a heater comprised of heater elements adapted to be replaceable on one-heater-element basis, thereby reducing costs for repair of the heater. Preferably, the heat treatment apparatus can suppress undesired reactions between a heat-generating portion of each heater element and a heat insulator constituting a refractory lining of the electric furnace and suppress a contraction of the heat insulator, thereby providing the electric furnace with a prolonged service life.

Another object of the present invention is to provide an ultra-high-temperature heat treatment apparatus permitting a joining portion between a furnace tube and a manifold to be disposed in a high-temperature environment and providing an increased length of a uniform temperature zone. Preferably, the heat treatment apparatus is arranged to perform evacuation through a slit formed in an upper face of the manifold so as to tightly seal the joining portion and to reduce metal contamination.

A further object of the present invention is to provide an ultra-high-temperature heat treatment apparatus which can reduce heat conduction from a furnace tube by means of a heat insulating apparatus and make it easy to cool a buffer-installed portion of the heat-insulating apparatus at low costs.

A still another object of the present invention is to provide an ultra-high-temperature heat treatment apparatus capable of unremovably holding an O-ring disposed between a manifold and a flange which constitute a contamination control apparatus, thereby positively preventing contamination.

A still another object of the present invention is to provide an ultra-high-temperature heat treatment apparatus capable of easily separating a heat-treatment object, preferably a wafer, from an annular holder for holding the heat-treatment object, thereby improving work efficiency.

According to one aspect of the present invention, there is provided an ultra-high-temperature heat treatment apparatus which comprises an electric furnace including a heater comprised of heater elements which are replaceable independently of each other, each heater element being disposed so as not to be in close contact with an inner wall face of a heat insulator of the electric furnace.

With the heat treatment apparatus of this invention, the heater elements of the heater of the electric furnace can be replaced on one-heater-element basis, thereby extremely reducing costs for fabrication and repair of the heater.

Preferably, each heater element includes a heat-generating portion disposed along the inner wall face of the heat insulator so as not to be in close contact therewith, and a fixture portion fixed to the heat insulator.

With this preferred arrangement, it is possible to suppress undesired reactions between the heat-generating portion of each heater element and the heat insulator as well as a contraction of the heat insulator, thereby permitting the heater elements to perform a stable heat-generating action at high temperatures. In addition, the heat-generating portions of the heater elements are not subject to mechanical constraint and hence deterioration of their durability due to thermal deformation stress is less likely to occur, so that the heater has a prolonged service life.

According to another aspect of the present invention, there is provided an ultra-high-temperature heat treatment apparatus which comprises a furnace tube, which is preferably made of porous SiC/CVD-SiC, and a manifold made of quartz and disposed beneath the furnace tube.

With the ultra-high-temperature heat treatment apparatus of the present invention, the length of a uniform temperature zone of the furnace tube can be increased by the provision of the quartz manifold disposed beneath the furnace tube preferably made of porous SiC/CVD-SiC, and a heat shock applied to the SiC/CVD-SiC furnace tube can be relieved.

Preferably, a slit is formed in an upper face of the quartz manifold at which the quartz manifold is joined to the furnace tube, and the slit is communicated with a vacuum evacuation system.

With this preferred arrangement, intermediate evacuation can be made through the slit formed in a joining face between the furnace tube and the quartz manifold and communicating with a vacuum evacuator system, thereby sealing the joining face. In the case of the Sic/CVD-SiC furnace tube for use with the quartz manifold communicating with the evacuation system, especially, metal contamination can be suppressed.

According to a further aspect of the present invention, there is provided an ultra-high-temperature heat treatment apparatus which comprises a furnace tube preferably made of porous SiC/CVD-SiC and a heat-insulating apparatus fitted into the furnace tube for interrupting heat conduction from the furnace tube. The heat-insulating apparatus includes a SiC buffer and a quartz buffer disposed beneath the SiC buffer.

With the ultra-high-temperature heat treatment apparatus of this invention, downward heat conduction from the furnace tube preferably made of porous SiC/CVD-SiC can be suppressed by the heat-insulating apparatus, and the cooling of a buffer-installed portion of the heat-insulating apparatus can be made with ease at low costs.

According to a further aspect of the present invention, there is provided an ultra-high-temperature heat treatment apparatus which comprises a furnace tube preferably made of porous SiC/CVD-SiC and a contamination control apparatus disposed beneath the furnace tube for preventing contamination in the furnace tube. The contamination control apparatus includes a quartz manifold and a quartz flange disposed beneath the quartz manifold. The quartz manifold and the quartz flange are each formed into an annular shape having a slanted peripheral face and are joined at their slanted peripheral faces to each other. An O-ring is fitted into a recess formed in one of the slanted peripheral faces of the quartz manifold and the quartz flange.

With the ultra-high-temperature heat treatment apparatus of this invention, the O-ring is unremovably held between the quartz manifold and the quartz flange which constitute the contamination control apparatus, whereby contamination in the furnace tube can be positively prevented by the contamination control apparatus.

According to a still another aspect of the present invention, there is provided an ultra-high-pressure heat treatment apparatus which comprises a separator mechanism for separating a heat-treatment object from an annular holder, which is larger in outer diameter than the heat-treatment object, for holding the heat-treatment object. The heat-treatment object, which is preferably a wafer, is subject to heat treatment in a furnace tube preferably made of porous SiC/CVD-SiC. The separator mechanism includes a holding portion for holding an outer peripheral portion of the annular holder, and a base portion disposed in alignment with a center axis of the separator mechanism and having a height thereof greater than that of the holding portion and an outer diameter thereof smaller than an inner diameter of the annular holder.

With the ultra-high-temperature heat treatment apparatus of this invention, when the annular holder and the heat-treatment object, preferably a wafer, held by the annular holder are placed together on the separator mechanism, only the annular holder reaches a vertical level below the upper face of the base portion of the separator mechanism, while permitting the base portion to be inserted into a central hole of the annular holder, and, at that vertical level, the outer peripheral portion of the annular holder is held by the holding portion of the separator mechanism, whereas the heat-treatment object is supported on the upper face of the base portion of the separator mechanism. As a result, the heat-treatment object is separated from the annular holder. In this manner, the heat-treatment object and the holder can be separated from each other with ease by simply placing the heat-treatment object and the holder together on the separator mechanism.

Preferably, the separator mechanism includes a housing which supports the holding portion of the separator mechanism. The holding portion is formed into an annular shape having an inner diameter smaller than an outer diameter of the annular holder. The base portion of the separator mechanism has an annular base extension extending from a lower part of the base portion and having an outer peripheral part thereof supported by an upper face of the annular holding portion of the separation mechanism.

With this preferred arrangement, when the base portion of the separation mechanism is placed on the annular holding portion supported by the housing of the separation mechanism, the annular base extension is held at its outer peripheral part by the annular holding portion, so that the base portion is disposed in alignment with the center axis of the separation mechanism.

More preferably, the separation mechanism includes separation mechanism sections which are disposed at interval in a vertical direction of the housing. Each separation mechanism section includes an annular holding portion supported by the housing and a base portion having an annular base extension.

With this preferred arrangement, when an annular holder and a heat-treatment object held by the holder are placed together on a lowermost separation mechanism section after a base portion of the lowermost separation mechanism section is positioned by placing a corresponding annular base extension on a corresponding annular holding portion, the heat-treatment object and the holder are held by the base portion and the holding portion of the lowermost separation mechanism section, respectively, to be separated from each other. Then, an annular base extension of the next lowermost separation mechanism section is placed on a corresponding annular holding portion, and thereafter, a heat-treatment object and a holder are separately held by the separation mechanism section. By repeating the above procedure, a number of heat-treatment objects, preferably wafers, can be disposed at intervals vertically of the separation mechanism.

Furthermore, structural features of the aforementioned first to fifth aspects and their preferred variants can be combined in various manners.

BRIEF DESCRIPTION OF THE DRAWINGS

FIGS. 4A and 4B show a partly broken front view and a right side view, respectively, of a heater element of an electric furnace of the heat treatment apparatus;

DETAILED DESCRIPTION

An ultra-high-temperature heat treatment apparatus of a vertical type according to an embodiment of the present invention will be explained with reference to the accompanying drawings.

Figure 1:
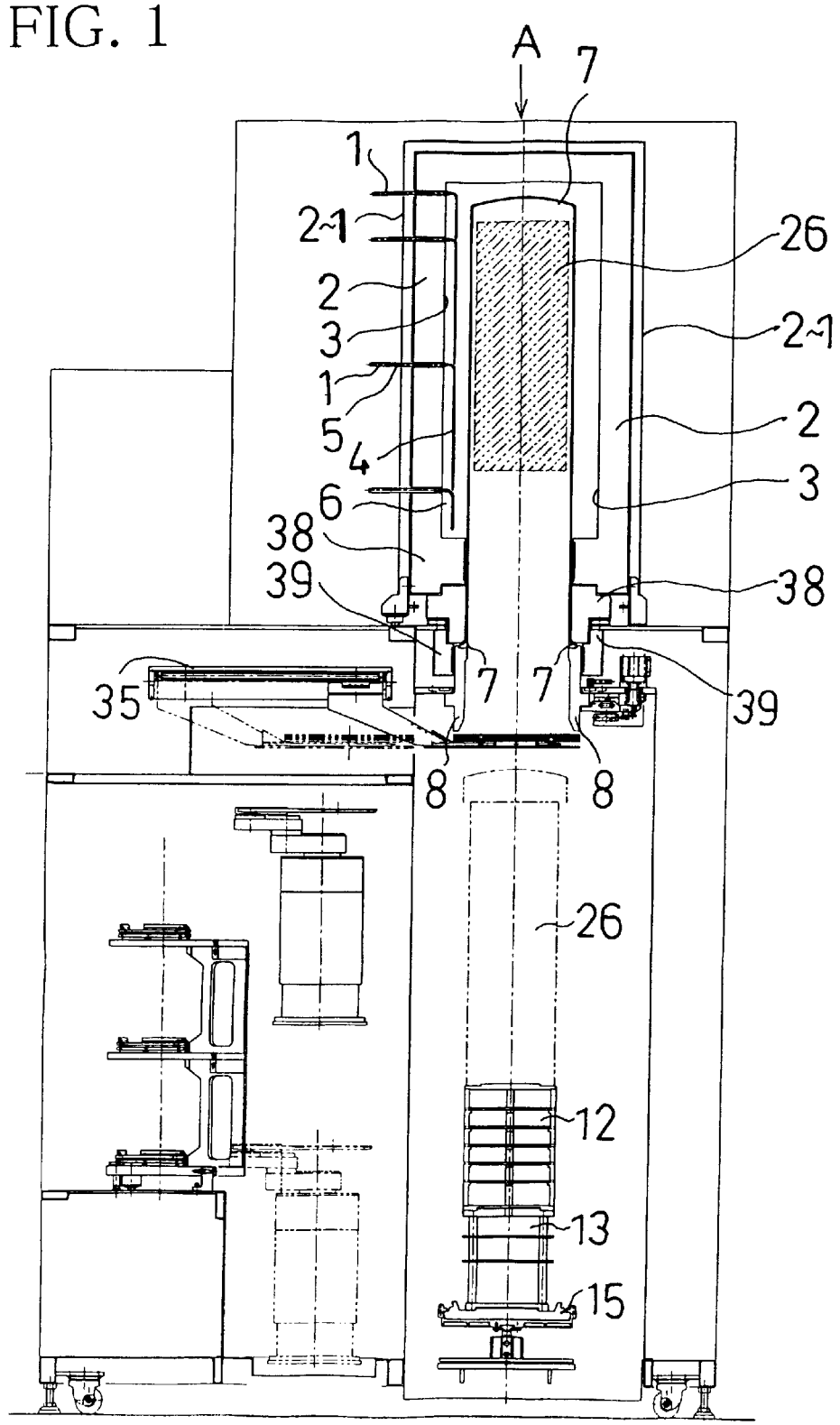
FIG. 1 is a front view showing an ultra-high-temperature heat treatment apparatus according to an embodiment of the present invention.
Figure 2:
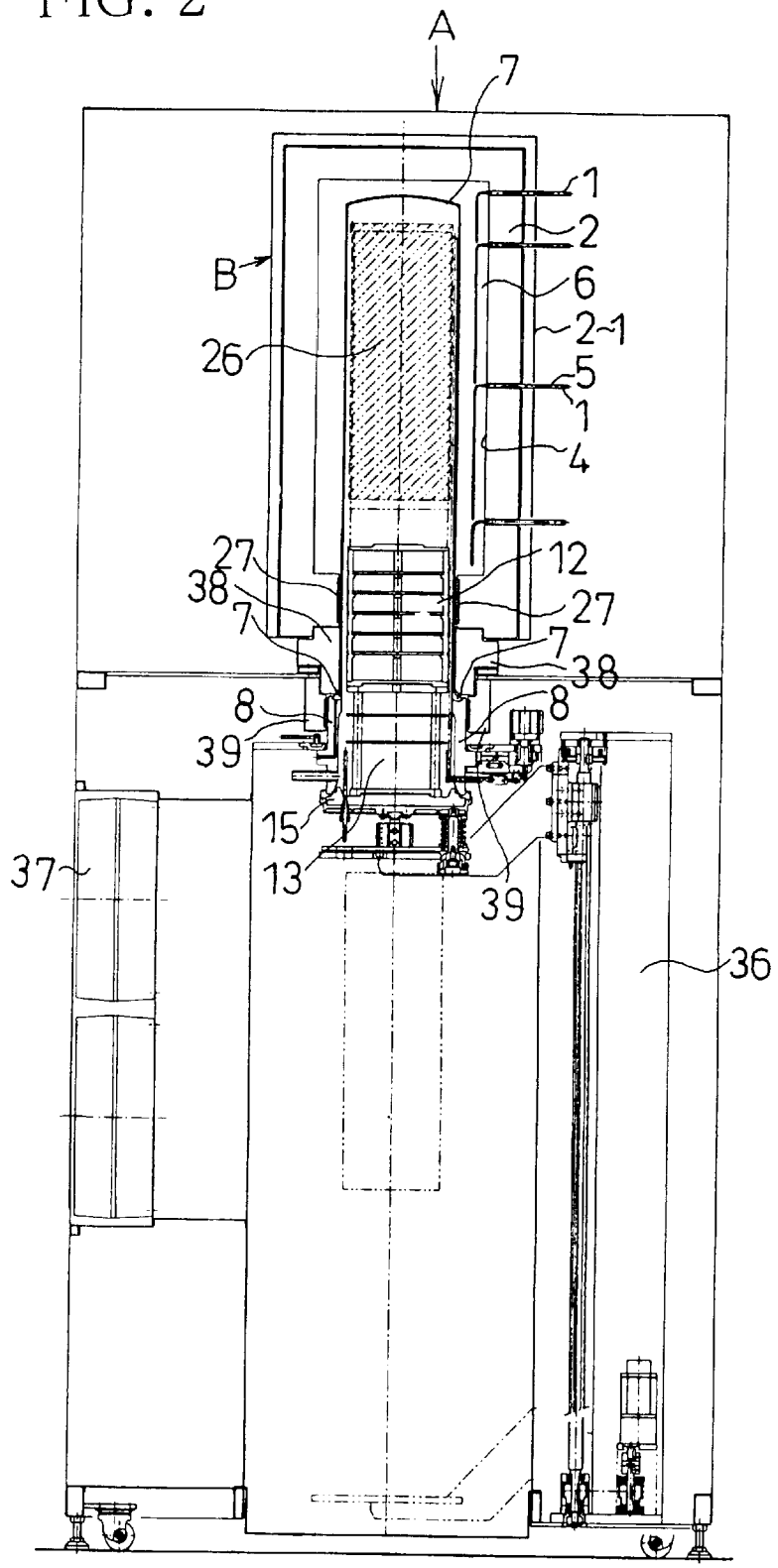
FIG. 2 is a rear view of the heat treatment apparatus shown in FIG. 1.
Figure 3:
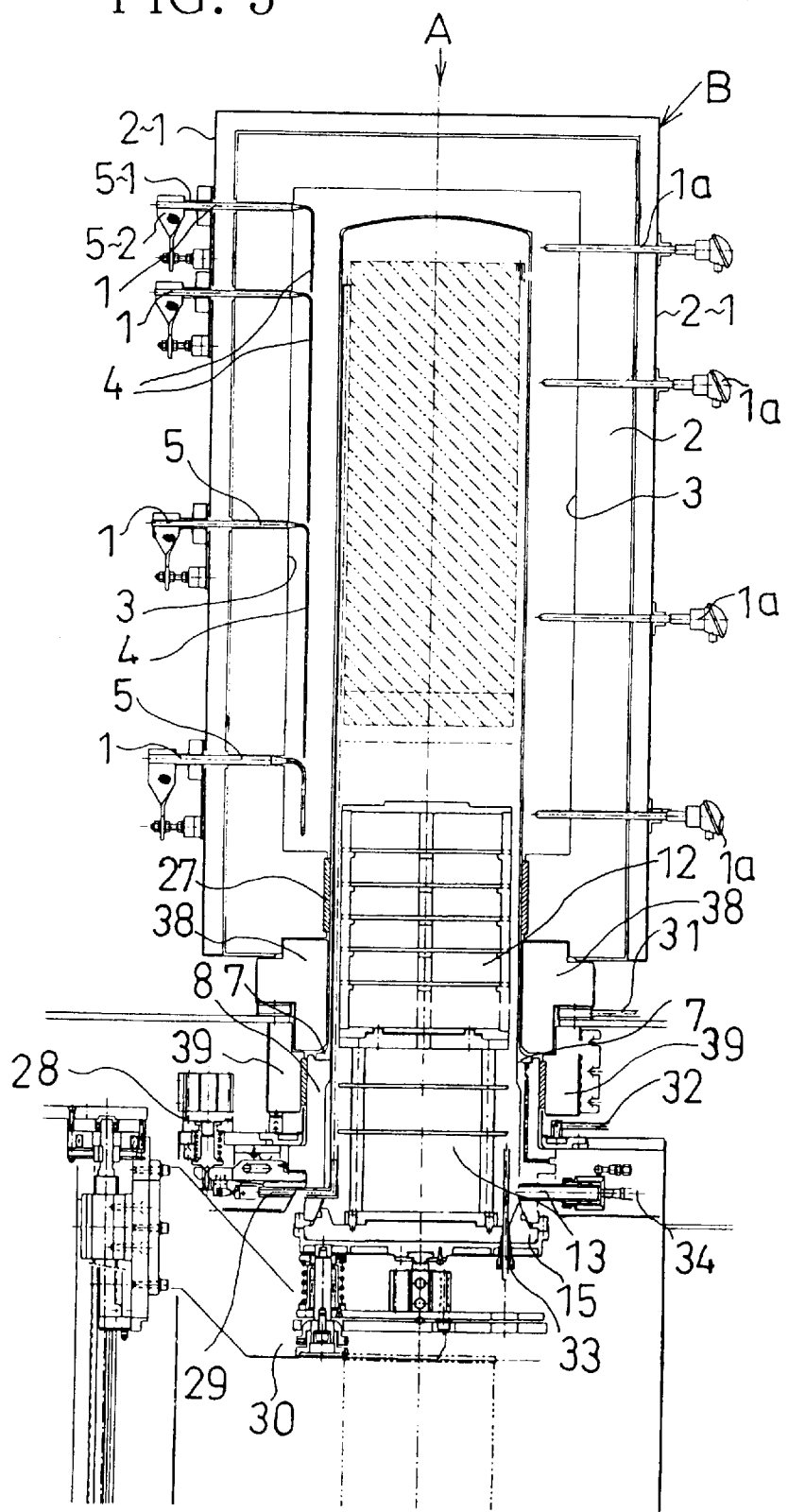
FIG. 3 is an enlarged front view showing, partly broken, a primary part of the heat treatment apparatus.
Figure 5:
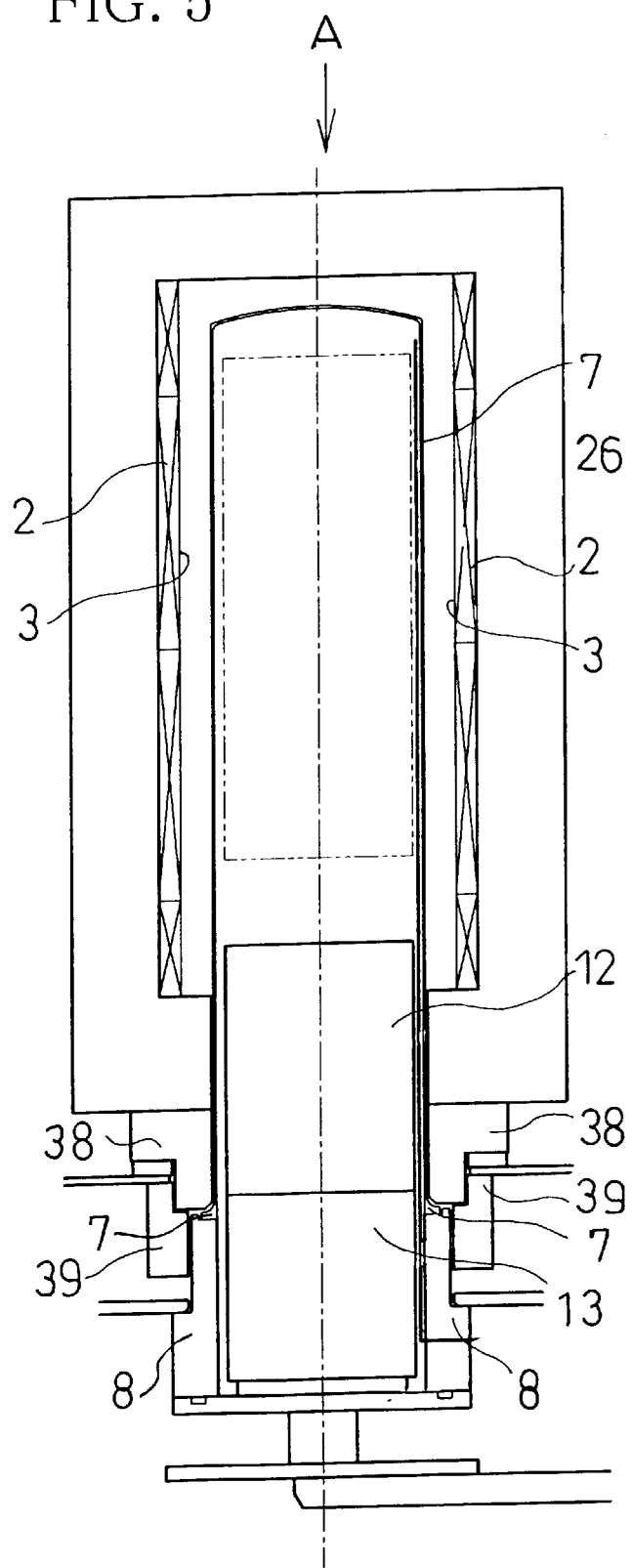
FIG. 5 is a fragmentary schematic view of the heat treatment apparatus shown in FIG. 1.

As shown in FIGS. 1 to 3, the ultra-high-temperature heat treatment apparatus A includes an electric furnace B operable at temperatures up to 1,500° C. and constituting a primary part of the heat treatment apparatus A. The electric heater B includes a heater which is comprised of heater elements 1. These heater elements 1 are installed in the electric furnace B such that they are not in close contact with the inner wall face 3 of a heat insulator 2 of the electric furnace B and they are replaceable one by one. As illustrated in FIGS. 4A and 4B, each heater element 1 is comprised of a heat-generating portion 4 formed into a U-shape as seen from front and two fixture portions 5 extending from proximal ends of the heat-generating portion 4 at, e.g., right angles.

For the installation of the heater to the electric furnace B, as shown in FIGS. 1–3, the fixture portions 5 of each heater element 1 are disposed to pass through the heat insulator 2 of the electric furnace B, and the heat-generating portion 4 of the heater element 1 is disposed along the inner wall face 3 of the heat insulator 2 so as to be unfixed to and out of contact with the wall face 3 of the insulator 2. Further, the fixture portions 5 of each heater element 1 are fixed to an outer wall 2-1 which surrounds the heat insulator 2 with a desired clearance. More specifically, the fixture portions 5 of each heater element 1 are fixed at their proximal end portions, which project outwardly of the outer wall 2-1, to the outer wall 2-1 by means of a stopper 5-1 and a net wire 5-2. Since the heater elements 1 of the heater are mounted to the heat insulator 2 independently of each other in this manner, one or more damaged heater elements 1 can be replaced on one-heater-element basis. In this regard, the heater of the present embodiment quite differs from the aforementioned conventional heater structure which requires the replacement of the whole heater even when the one-piece heater is partly damaged. The heater-element basis replacement makes it possible to greatly reduce costs for remedial work. Reference numeral 6 denotes a clearance between the heat-generating portions of the heater elements 1 and the inner wall face 3 of the heat insulator 2.

In the electric furnace B, the heat-generating portions 4 of the heater elements 1 of the heater are disposed along the wall face 3 of the heat insulator 2 with a desired clearance, as-explained above. This makes it possible to suppress undesired reactions between the heat-generating portions 4 and the heat insulator 2 as well as a contraction of the heat insulator 2. Thus, the heater is enabled to make a stable heat-generating action up to a predetermined high temperature. Since the heat-generating portions 4 of the heater elements 1 are subject to substantially no mechanical constraint, a deterioration in their durability caused by heat deformation stress is less likely to occur, so that the service life of the heater is prolonged. The heat-generating portions of the heater elements 1, which are arranged to be out of contact with the heat insulator 2, can reduce heat-generation loss.

The number of the heater elements 1 constituting the heater may vary depending on the size, a desired performance capacity and the like of the electric furnace B.

The heat treatment apparatus A of the present embodiment will be further explained.

As shown in FIGS. 1 to 3 and 5, the heat treatment apparatus A further comprises a porous SiC/CVD-SiC furnace tube 7 and a manifold 8 disposed beneath the furnace tube 7. The heat treatment apparatus A is featured in that the manifold 8 is made of quartz.

In a conventional heat treatment apparatus, a water-cooled metal manifold is used and an O-ring or the like for preventing intrusion of contaminants from the outside is provided at a joining portion between the furnace tube 7 and the manifold. This makes it difficult to fabricate a furnace tube which is long in tube length or in the length of a uniform temperature zone.

Contrary to this, the present embodiment using a quartz manifold 8 makes it possible to dispose a joining portion between the furnace tube 7 and the manifold 8 in a high temperature environment, so that the length of a uniform temperature zone may be increased. Furthermore, a heat shock applied to the porous SiC/CVD-SiC furnace tube can be relieved and fabrication costs of the heat treatment apparatus A can be reduced.

Figure 6:
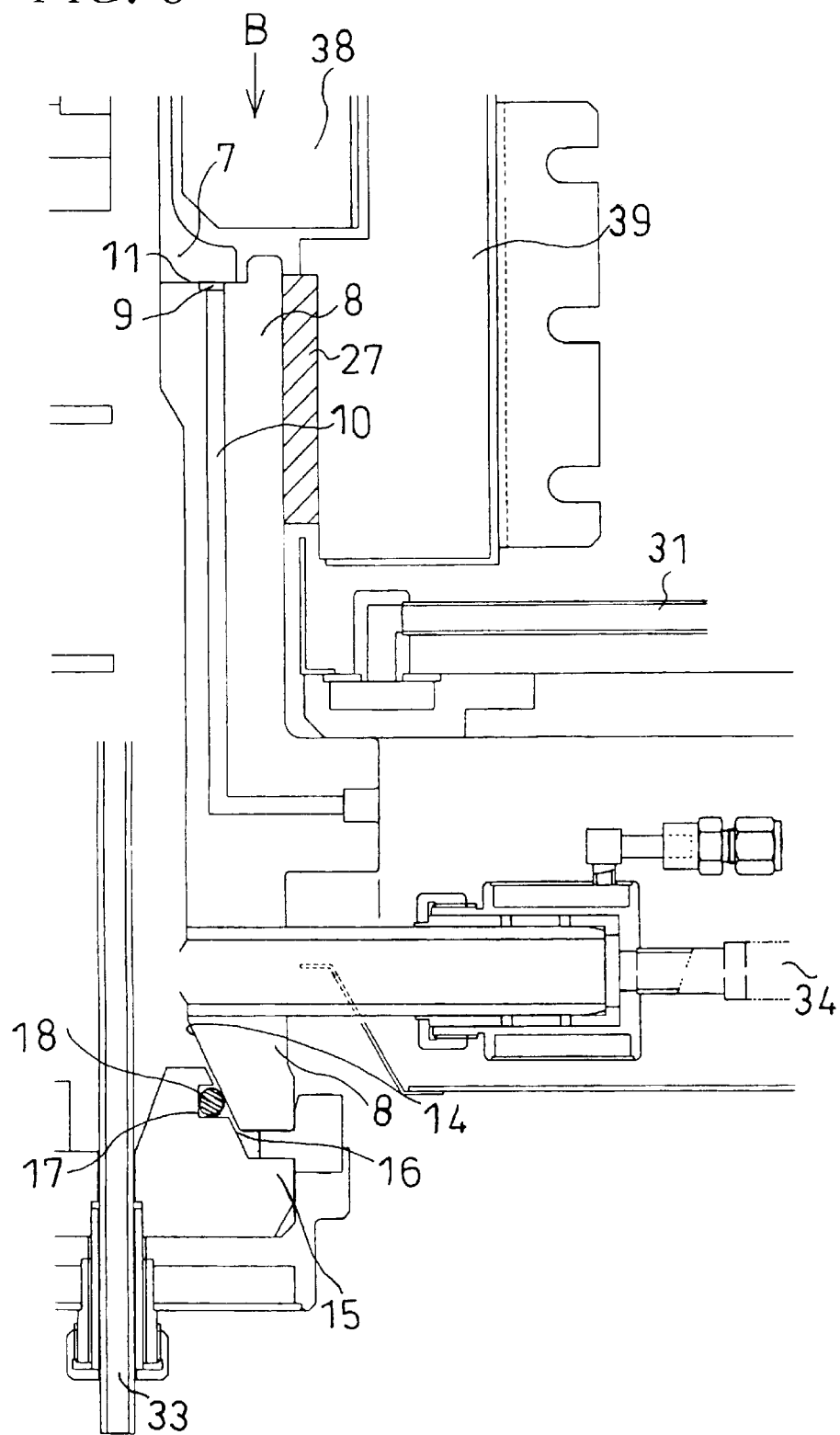
FIG. 6 is a an enlarged longitudinal sectional view showing, partly broken, a primary part of the heat treatment apparatus.
Figure 7:
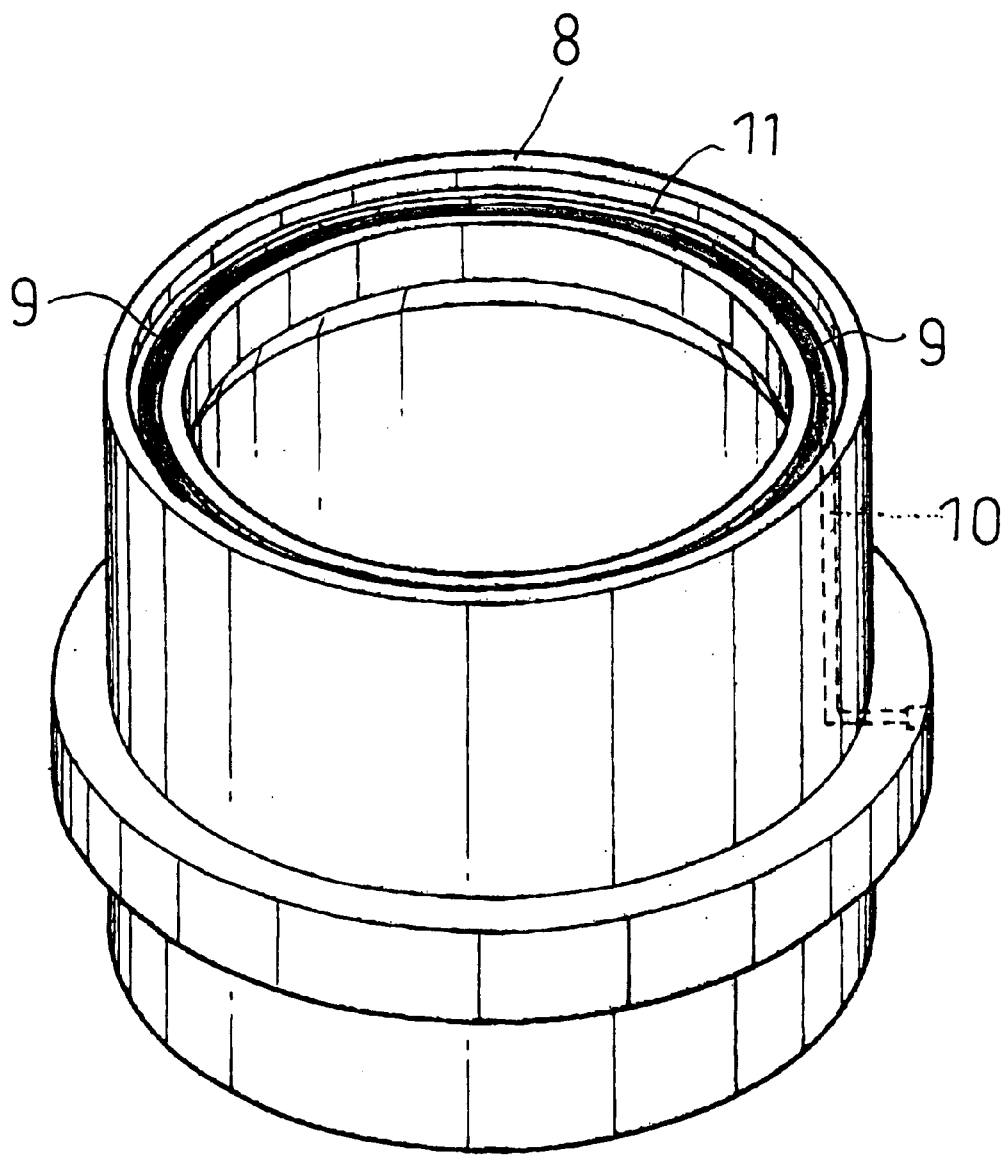
FIG. 7 is a perspective view of a quartz manifold of the heat treatment apparatus.

As shown in FIGS. 6 and 7, an annular slit 9 is formed in an upper face 11 of the quartz manifold 8 to which face the porous SiC/CVD-SiC furnace tube 7 is joined, and the slit 9 is communicated with a vacuum evacuation passage 10. The size, shape and the like of the slit 9 are not limited to those illustrated in FIGS. 6 and 7.

The reason why the slit 9 is provided at the joining portion between the furnace tube 7 and the manifold 8 resides in that, when an O-ring or the like is inserted into the joining portion, the O-ring is subject to high-temperature environment to be deteriorated. With the arrangement where the slit 9 formed in the upper face 11 of the manifold 8 communicates with the vacuum evacuation passage 10, the furnace tube 7 is applied with vacuum produced in the slit 9 to be tightly contacted with the manifold 8, so that the joining portion is sealed. Further, high-temperature heat around the joining portion is discharged. Metal pollution can be reduced since the vacuum evacuation passage 10 is formed in the manifold 8 made of quartz and is opened to the furnace tube 7 made of SiC/CVD-SiC.

The heat treatment apparatus A is provided with a heat-insulating apparatus which is fitted into the porous SiC/CVD-SiC furnace tube 7 and which includes a SiC buffer 12 and a quartz buffer 13 disposed beneath the buffer 12. The heat-insulating apparatus reduces downward heat conduction from the furnace tube 7, and makes it easy to cool the buffer-installed portion of the heat-insulating apparatus. Accordingly, a reduction in costs can be achieved as compared to a conventional heat-insulating apparatus, consisting of a SiC buffer, for a porous SiC/CVD-SiC furnace tube.

As shown in FIG. 6, the heat treatment apparatus A further includes a contamination control apparatus, disposed beneath the porous SiC/CVD-SiC furnace tube 7, for preventing contamination in the furnace tube 7. The contamination control apparatus includes the aforementioned quartz manifold 8 and a quartz flange 15 disposed beneath the manifold 8. The manifold 8 and the flange 15, each formed into an annular shape, have a slanted inner peripheral face 14 and an outer peripheral face 16, respectively. An O-ring 18 is unremovably fitted into a recess 17 formed in the slanted outer peripheral face 16 of the flange, 15. To be noted, the O-ring 18 is not simply inserted between the slanted inner peripheral face 14 of the manifold 8 and the slanted outer peripheral face 16 of the flange 15, but is fitted in the recess 17 formed in the flange 15 located below the manifold 8, whereby the O-ring 18 is prevented from being removed from between the manifold 8 and the flange 15. The slanted angles of the slanted peripheral faces 14 and 16 are not limited to those shown in FIG. 6. The O-ring 18 is made from a material which is excellent in high-temperature heat resistance and durability.

Figure 8:
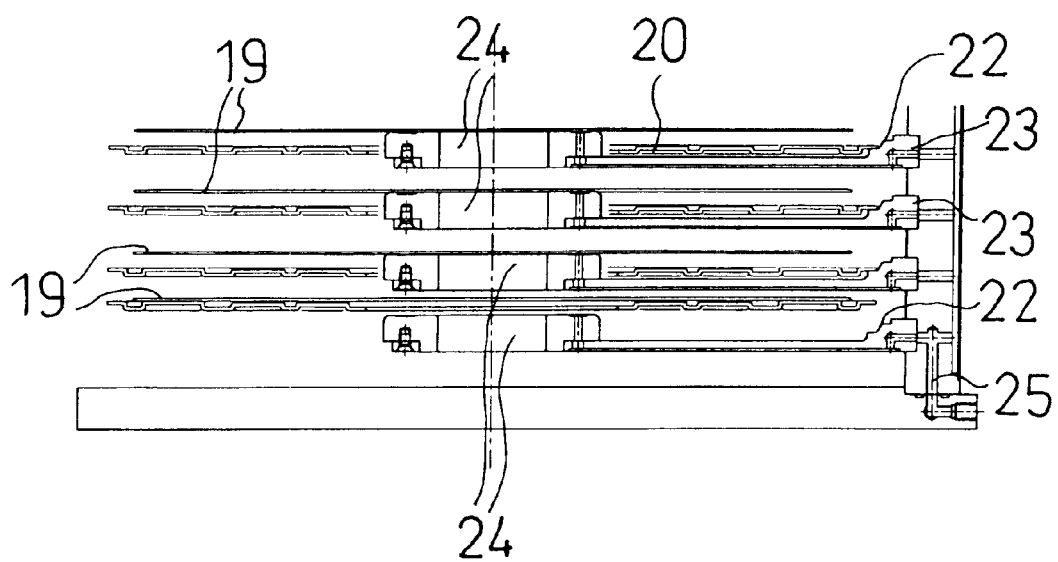
FIG. 8 is a longitudinal sectional front view showing a separation mechanism for separating a wafer from a holder, which wafer is a heat-treatment object in the heat treatment apparatus.
Figure 9:
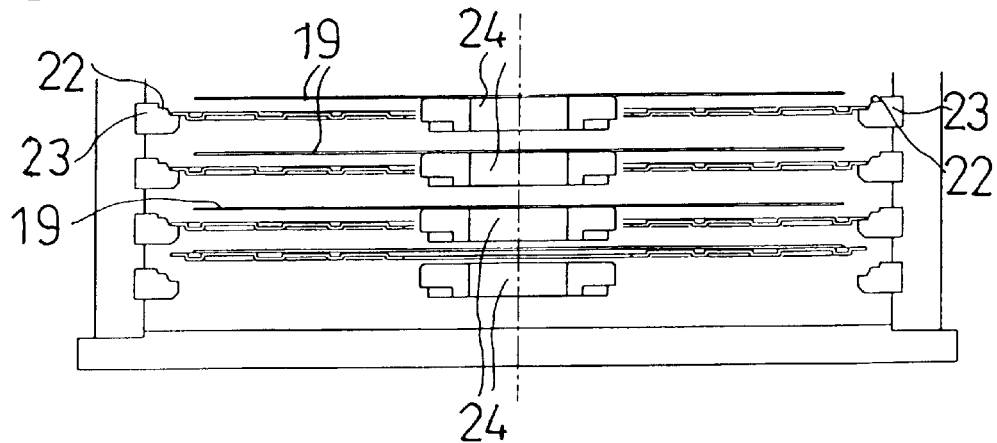
FIG. 9 is a right side view of the separation mechanism shown in FIG. 8.
Figure 10:
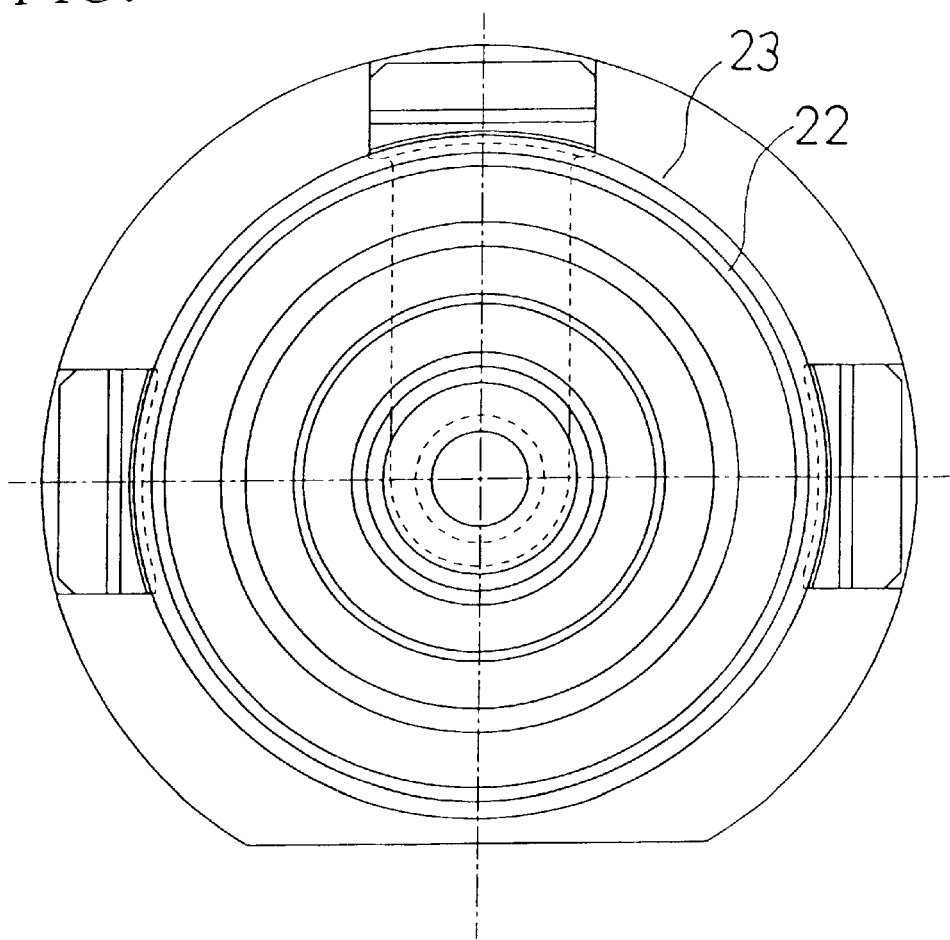
FIG. 10 is a plan view of the separation mechanism.

As shown in FIGS. 8 to 10, the heat treatment apparatus A comprises a separator mechanism for separating a wafer 19 from an annular holder 20 larger in outer diameter than the wafer 19 which is subject to heat treatment in the porous SiC/CVD-SiC furnace tube 17. The separator mechanism includes a holding portion 23 for holding an outer peripheral portion of the annular holder 20. The holding portion 23 is formed with a plurality of stepped portions 22 which enable the holding portion to hold a desired one of holders 20 having different outer diameters. The separator mechanism also includes a base portion 24 disposed in alignment with a center axis of the seperator mechanism and having a height thereof greater than that of the holding portion 23 and an outer diameter thereof smaller than an inner diameter of the annular holder 20. Reference numerals 25 denotes a vacuum evacuation passage used to attract wafers 19 by suction.

When the annular holder 20 and the wafer 19 held by the holder are placed together on the separator mechanism, only the annular holder 20 reaches a vertical level below the upper face of the base portion 24, while permitting the base portion 24 to be inserted into a central hole of the annular holder 20, and, at that vertical level, the outer peripheral portion of the annular holder 20 is held by the holding portion 23, whereas the wafer 19 is supported on the upper face of the base portion 24. As a result, the wafer 19 is separated from the holder 20. Wafers 19 placed on base portions 24 are transferred to predetermined positions by means of an automatic transfer apparatus.

The heat treatment apparatus A of the present embodiment for use in heat treatment for wafers may be configured in the form of a vertical vapor deposition apparatus as described in JP-A-5-86478 incorporated by reference herein.

As explained above, the heat treatment apparatus A for heat treatment or vapor deposition is provided with a vertical furnace tube located above a manifold which is disposed above a flange. A joining portion between the manifold and the furnace tube is hermetically sealed. Further, a heater is arranged around the furnace tube.

A cooling-water circulating portion provided in the vicinity of the joining portion is supplied with cooling water which circulates therein. The manifold is provided with a gas inlet port through which ambient gas for heat treatment or process gas for vapor deposition is supplied, and an exhaust port communicating with a vacuum pump for evacuating the interior of the furnace tube. Typically, ambient gas or process gas is supplied to the furnace tube after the interior of the furnace tube is heated by means of the heater and is evacuated by means of the vacuum pump. The heat-treatment objects such as silicon wafers are mounted on a boat located above the flange.

In connection with the heating and evacuation of the furnace tube, the gas supply to the furnace tube and the boat transfer, the heat treatment apparatus A further includes elements shown in FIGS. 1–3, 4 and 5 and listed below. Reference numeral 26 denotes a SiC boat/holder disposed for vertical motion in the furnace tube 7; 27, a wool heat insulator mounting portion which is mounted to the inside of a lower part of the heat insulator 2; 28, a lock mechanism for the manifold 8; 29, a gas inlet port communicating with the interior of the electric furnace; 30, a boat elevator mechanism; 31 and 32, cooling water inlet and outlet ports; 36, a boat elevator mechanism; 37, ambient gas inlet port; 38, a cylindrical insulator; 39, a two-part insulator; and 1a, thermocouples for temperature measurement for respective furnace zones.

The references herein to a porous SiC/CVD-SiC furnace tube are toga furnace tube made from porous silicon carbide coated with chemical vapor deposited silicon carbide. The chemical vapor deposited silicon carbide coats both surfaces of the furnace tube 7.

What is claimed is:

1. An ultra-high-temperature heat treatment apparatus, comprising:
   a furnace tube; and
   a heat-insulating apparatus fitted into the furnace tube for interrupting heat conduction from the furnace tube, said heat-insulating apparatus including a SiC buffer and a quartz buffer disposed beneath the SiC buffer.

2. The ultra-high-temperature heat treatment apparatus according to claim 1, wherein said furnace tube is made of porous silicon carbide coated with chemical vapor deposited silicon carbide.

3. An ultra-high-temperature heat treatment apparatus, comprising:
   a furnace tube; and
   a contamination control apparatus disposed beneath the furnace tube for preventing contamination in the furnace tube, said contamination control apparatus including a quartz manifold and a quartz flange disposed beneath the quartz manifold, said quartz manifold and said quartz flange being each formed into an annular shape having a slanted peripheral face and being joined at their slanted peripheral faces to each other, an O-ring being fitted into a recess formed in one of the slanted peripheral faces of the quartz manifold and the quartz flange.

4. The ultra-high-temperature heat treatment apparatus according to claim 3, wherein said furnace tube is made of porous silicon carbide coated with chemical vapor deposited silicon carbide.

5. An ultra-high-pressure heat treatment apparatus, comprising:
   a separator mechanism for separating a heat-treatment object from an annular holder, which is larger in outer diameter than the heat-treatment object, for holding the heat-treatment object, said heat-treatment object being subject to heat treatment in a furnace tube, said separator mechanism including a holding portion for holding an outer peripheral portion of the annular holder, and a base portion disposed in alignment with a center axis of the separator mechanism and having a height thereof greater than that of the holding portion and an outer diameter thereof smaller than an inner diameter of the annular holder.

6. The ultra-high-temperature heat treatment apparatus according to claim 5, wherein said furnace tube is made of porous silicon carbide coated with chemical vapor deposited silicon carbide, and said heat-treatment object is a wafer.

7. An ultra-high-temperature heat treatment apparatus, comprising:
   an electric furnace including a heater comprised of heater elements which are replaceable independently of each other;

a furnace tube made of porous silicon carbide coated with chemical vapor deposited silicon carbide;

a heat-insulating apparatus fitted into the furnace tube for interrupting heat conduction from the furnace tube;

a contamination control apparatus disposed beneath the furnace tube for preventing contamination in the furnace tube; and a separator mechanism for separating a heat-treatment object from an annular holder, which is larger in outer diameter than the heat-treatment object, for holding the heat-treatment object, said heat-treatment object being subject to heat treatment in a furnace tube;

wherein each heater element includes a heat-generating portion disposed along the inner wall face of the heat insulator so as not to be in close contact therewith, and a fixture portion fixed to the heat insulator, said heat-insulating apparatus includes a SiC buffer and a quartz buffer disposed beneath the SiC buffer, said contamination control apparatus includes a quartz manifold disposed beneath the furnace tube and a quartz flange disposed beneath the quartz manifold, said quartz manifold and said quartz flange being each formed into an annular shape having a slanted peripheral face and being joined at their slanted peripheral faces to each other, an O-ring being fitted into a recess formed in one of the slanted peripheral faces of the quartz manifold and the quartz flange, a slit is formed in an upper face of the quartz manifold at which the quartz manifold is joined to the furnace tube, said slit being communicated with a vacuum evacuation system, and said separator mechanism includes a holding portion for holding an outer peripheral portion of the annular holder, and a base portion disposed in alignment with a center axis of the separator mechanism and having a height thereof greater than that of the holding portion and an outer diameter thereof smaller than an inner diameter of the annular holder.

* * * * *